United States Patent
Arakawa et al.

(10) Patent No.: US 7,371,450 B2
(45) Date of Patent: May 13, 2008

(54) ELECTROMAGNETIC SHIELDING SHEET

(75) Inventors: Fumihiro Arakawa, Shinjuku-Ku (JP);
Yasuhiko Ishii, Shinjuku-Ku (JP);
Daisuke Hashimoto, Shinjuku-Ku (JP);
Yukihiro Kyoden, Shinjuku-Ku (JP);
Eiji Ohishi, Shinjuku-Ku (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 291 days.

(21) Appl. No.: 10/521,997

(22) PCT Filed: Aug. 6, 2003

(86) PCT No.: PCT/JP03/10020

§ 371 (c)(1),
(2), (4) Date: Jan. 19, 2005

(87) PCT Pub. No.: WO2004/016058

PCT Pub. Date: Feb. 19, 2004

(65) Prior Publication Data

US 2005/0244609 A1    Nov. 3, 2005

(30) Foreign Application Priority Data

Aug. 8, 2002    (JP)    ............... 2002-230844

(51) Int. Cl.
*B32B 3/24*    (2006.01)
*H05K 9/00*    (2006.01)

(52) U.S. Cl. ............... 428/138; 174/35 MS
(58) Field of Classification Search ............... 428/138; 174/35 MS
See application file for complete search history.

(56) References Cited

U.S. PATENT DOCUMENTS 6,884,936 B2 *   4/2005   Takahashi et al. .......... 174/389

FOREIGN PATENT DOCUMENTS

| | | |
|---|---|---|
| JP | A 61-015480 | 1/1986 |
| JP | A 05-283889 | 10/1993 |
| JP | A 09-293989 | 11/1997 |
| JP | A 10-335885 | 12/1998 |
| JP | 11-266096 | 9/1999 |
| JP | 2000-183585 | 6/2000 |
| WO | WO 02/071824 | 9/2002 |

* cited by examiner

*Primary Examiner*—William P Watkins, III
(74) *Attorney, Agent, or Firm*—Oliff & Berridge, PLC

(57) ABSTRACT

An electromagnetic shielding sheet of the present invention includes a transparent base sheet and a metal layer attached to one surface of the transparent base sheet. The metal layer has a mesh part, a peripheral mesh part surrounding the mesh part, and a grounding frame surrounding the peripheral mesh part. A width of lines forming meshes in the peripheral mesh part gradually increases from the mesh part toward the grounding frame. The lines of the electromagnetic shielding sheet are scarcely bent or broken in all processes including fabricating and assembling processes, and the electromagnetic shielding sheet is excellent in handling ease.

12 Claims, 5 Drawing Sheets

ELECTROMAGNETIC SHIELDING SHEET

TECHNICAL FIELD (Summary of Technique)

The present invention relates to a sheet for suppressing (shielding) radiation of electromagnetic wave and, more specifically, to a sheet to be disposed on a front surface of a display, such as a CRT and a PDP, to suppress the radiation of electromagnetic wave generated by the display.

BACKGROUND ART

Troubles due to electromagnetic interference (EMI) have increased with functional advancement and prevalent use of electric and electronic devices. Electromagnetic noises are roughly classified into conduction noises and radiation noises.

A conduction-noise eliminating method uses a noise filter or the like. A radiation-noise eliminating method uses a metal case for electromagnetically isolating a space, another radiation-noise eliminating method inserts a metal sheet between wiring boards, and a third radiation-noise eliminating method coats a cable with a metal foil. These methods are effective in electromagnetically shielding circuits and power source blocks. Those shielding members used by the above methods are opaque and hence are not suitable for shielding electromagnetic wave emitted from a front surface of a display, such as a CRT and a plasma display panel (PDP).

The plasma display panel includes, in combination, a glass panel provided with data electrodes and a fluorescent layer, and another glass panel provided with transparent electrodes. When the plasma display panel operates, the plasma display panel generates intense electromagnetic radiation and near-infrared rays and a large amount of heat.

Generally, a front sheet is disposed on a front surface of the plasma display panel to shield the electromagnetic wave. The front sheet must be capable of reducing electromagnetic radiation of frequencies of 30 MHz to 1 GHz by 30 dB or above Near-infrared rays of wavelengths between 800 and 1,100 nm emitted from the front surface of the display may also cause other devices, such as VTRs, to malfunction. Therefore, radiation of the near-infrared rays must be suppressed as well as the radiation of the electromagnetic wave.

In order to make images displayed by the display clearly visible, lines forming a metal mesh of a front sheet for electromagnetic shielding must be invisible, meshes are arranged regularly and the front sheet must have proper transparency (visible-light transmitting characteristics, visible-light transmittance).

Generally, the plasma display panel is characterized by its large panel size. An electromagnetic shielding sheet for a 37-inch PDP is as large as 621 mm×831 mm, and an electromagnetic shielding sheet for a 42-inch PDP is as large as 983 mm×583 mm. Some electromagnetic shielding sheets have sizes greater than those. The boundary between a mesh part and a grounding frame of such a large electromagnetic shielding sheet are liable to be broken during each of processes for manufacturing the electromagnetic shielding sheet to for incorporating the electromagnetic shielding sheet into a display. Thus, such a large electromagnetic shielding sheet is very difficult to handle.

PRIOR ART

The front sheet for electromagnetic shielding is required to have an electromagnetic shielding ability, a proper transparency (visible-light transmittance) and excellent handling ease.

An electromagnetic shielding sheet disclosed in JP 5-283889 A to improve the visibility of a displayed image includes a base sheet, a transparent anchoring layer, and an electroless-plated layer of a mesh pattern, in which the transparent anchoring layer underlying the electroless-plated layer is changed into a black patterned layer by electroless plating.

A method disclosed in JP 61-15480 A forms a copper oxide film on the surface of a metal mesh included in an electromagnetic shielding sheet to suppress the reflection of external light.

A method of forming a mesh with black lines disclosed in JP 09-293989 A forms a metal mesh for an electromagnetic shielding sheet by a photoresist process using a black resist and leaves the black resist after the metal mesh has been formed.

An electromagnetic shielding structure disclosed in JP 10-335885 A is formed by laminating a plastic film provided with a copper foil patterned in a geometric pattern by a photolithographic process onto a plastic sheet.

All the foregoing methods of forming the mesh metal layers aim to form metal meshes of lines having a fixed width. Practically, meshes and lines in the boundary region between the mesh part and the grounding frame are unavoidable disarranged (disturbed) particularly during transportation. In addition, the rigidity of the boundary region between the mesh part and the grounding frame changes sharply. Therefore, it is possible that stress is concentrated in the boundary region and the meshes in the boundary region are bent or broken during each of processes for fabricating an electromagnetic shielding sheet to for combining the electromagnetic shielding sheet with a display. Thus, the electromagnetic shielding sheet is very difficult to handle. Therefore, expensive parts are wasted very frequently.

DISCLOSURE OF THE INVENTION

The present invention has been made to solve those problems. An object of the present invention is to provide an electromagnetic shielding sheet to be placed on or above the front surface of a display, such as a CRT or a PDP, to suppress the radiation of electromagnetic wave generated from the display, having regularly arranged meshes, capable of ensuring satisfactory visibility of images displayed by the display, of being formed in a large size without being spoilt by defects including brokenness of lines forming meshes throughout all the processes including fabricating and assembling processes, and of being easily handled.

The present invention is an electromagnetic shielding sheet comprising: a transparent base sheet; and a metal layer attached to one surface of the transparent base sheet; wherein the metal layer has a mesh part, a peripheral mesh part surrounding the mesh part, and a grounding frame surrounding the peripheral mesh part, and a width of lines forming meshes in the peripheral mesh part gradually increases from the mesh part toward the grounding frame.

The electromagnetic shielding sheet of the present invention shields the radiation of electromagnetic wave generated from a display, such as a CRT or a PDP, when the same is placed on or above the front surface of the display. In addition, the electromagnetic shielding sheet ensures the satisfactory visibility of displayed images because the meshes thereof are not disarranged, and can be formed in a large size without being spoilt by defects such as brokenness of lines forming meshes throughout all the processes including fabricating and assembling processes, and hence is excellent in handling ease.

Generally, lines forming meshes in the mesh part have a fixed width.

Preferably, the peripheral mesh part has one to fifty meshes, more preferably one to twenty-five meshes, in a direction from the grounding frame toward the mesh part.

Alternatively, preferably, the peripheral mesh part has a width between 0.15 and 15 mm, more preferably between 0.3 and 7.5 mm, in a direction from the grounding frame toward the mesh part.

In addition, preferably, the width of lines forming meshes in the peripheral mesh part continuously increases from the mesh part toward the grounding frame. Alternatively, preferably, the width of lines forming meshes in the peripheral mesh part stepwise increases from the mesh part toward the grounding frame. These facilitate handling the electromagnetic shielding sheet, and prevent the bending or permanent bending of the electromagnetic shielding sheet and the waste of expensive parts.

In addition, preferably, at least one of surfaces of the metal layer is treated by a blackening treatment. In the case, since the meshes themselves are blackened, a printing process for printing a black frame is unnecessary, and the electromagnetic shielding sheet is capable of maintaining the satisfactory visibility of displayed images for a long period of time; that is, the electromagnetic shielding sheet is capable of preventing the glaring of the screen of the display. In addition, in the case, it is preferable that an antirust layer is formed on at least the surface of the metal layer treated by the blackening treatment.

In addition, preferably, at least meshes in the mesh part and the peripheral mesh part are filled up with a resin for substantial planarization of the metal layer. Filling up the meshes with the resin facilitates various kinds of work.

In the case, it is preferable that the resin contains a color-correcting light absorber capable of absorbing visible light of wavelengths of 570 to 605 nm and/or a near-infrared absorber capable of absorbing light of wavelengths in a near-infrared region of 800 to 1100 nm.

In addition, preferably, a color-correcting light absorber layer capable of absorbing visible light of wavelengths of 570 to 605 nm and/or a near-infrared absorber layer capable of absorbing light of wavelengths in a near-infrared region of 800 to 1100 nm is provided on at least one surface of the electromagnetic shielding sheet.

The electromagnetic shielding sheet of the present invention can be disposed with the surface of the base sheet facing the PDP display. When the electromagnetic shielding sheet is thus disposed, steps and man-hours for electrode connecting work can be reduced.

BEST MODE FOR CARRYING OUT THE INVENTION

A preferred embodiment of the present invention will be described with reference to the accompanying drawings.

(Overall Structure)

Figure 1:
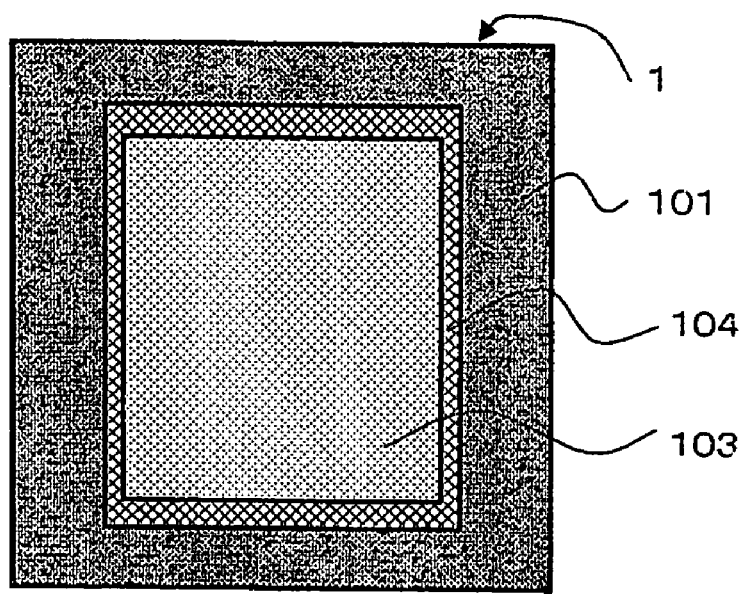
FIG. 1 is a plan view of an electromagnetic shielding sheet in a preferred embodiment according to the present invention.
Figure 2:
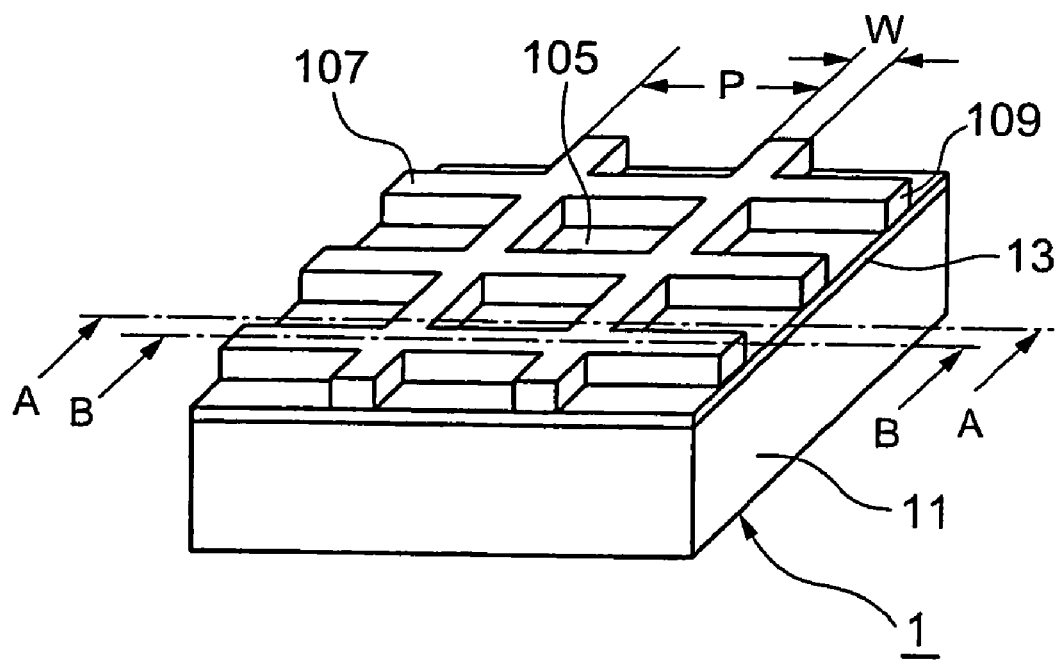
FIG. 2 is a schematic, fragmentary perspective view of the electromagnetic shielding sheet in the preferred embodiment.

FIG. 1 is a plan view of an electromagnetic shielding sheet in a preferred embodiment according to the present invention and FIG. 2 is a typical, fragmentary perspective view of the electromagnetic shielding sheet in the preferred embodiment.

Referring to FIG. 1, an electromagnetic shielding sheet 1 in a preferred embodiment according to the present invention includes a central mesh part 103 and a grounding frame 101 delineating the shape of the electromagnetic shielding sheet 1. The grounding frame 101 is grounded when the electromagnetic shielding sheet is incorporated into a display.

Referring to FIG. 2, the mesh part 103 is formed by bonding a conductive layer 109 to one surface of a base sheet 11 by an adhesive layer 13. The conductive layer 109 has a mesh structure having many densely arranged meshes (openings) 105. Lines 107 define the meshes 105. The lines 107 have a width, namely, line width W, and are arranged at pitches P.

A peripheral mesh part 104 extends between the mesh part 103 and the grounding frame 101. The peripheral mesh part 104 also has a mesh structure substantially similar to the mesh part 103. Lines defining the meshes of the peripheral mesh part 104 have a line width gradually increasing from the mesh part 103 toward the grounding frame 101.

(Component Layers)

Figure 3A:
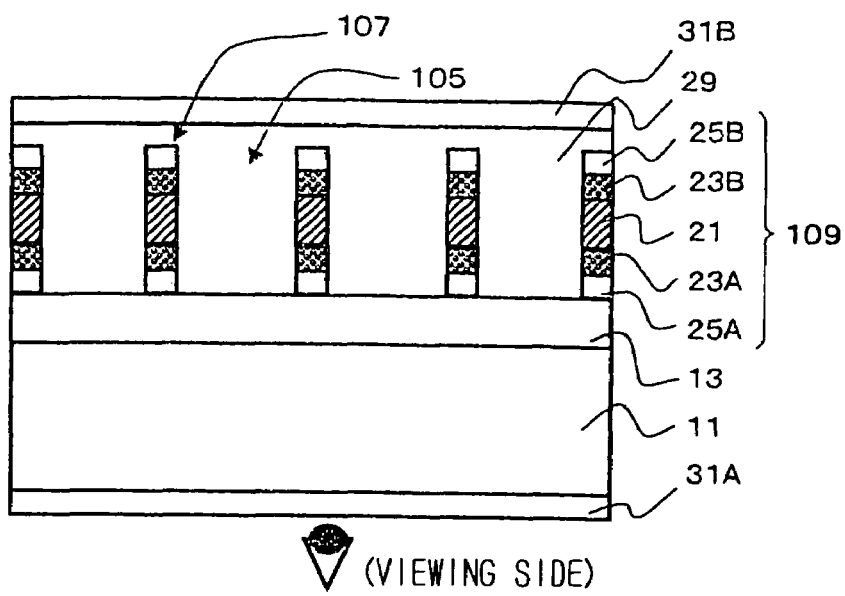
FIGS. 3(A) and 3(B) are sectional views taken along the lines A-A and B-B, respectively, in FIG. 2.
Figure 3B:
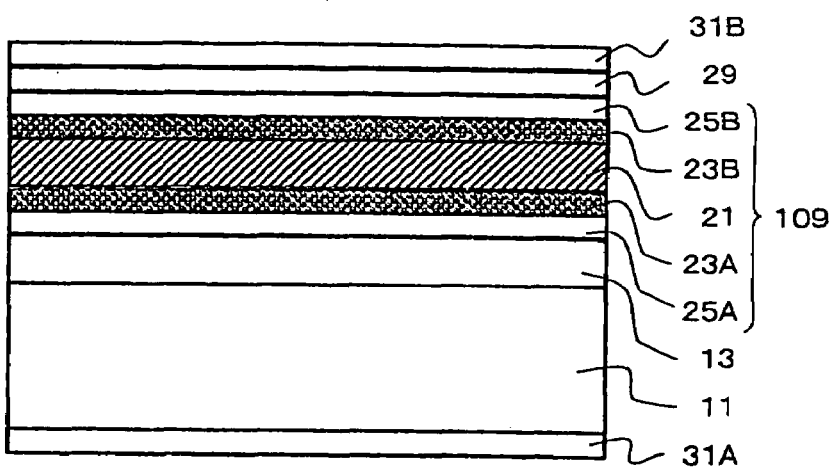
Figure 4:
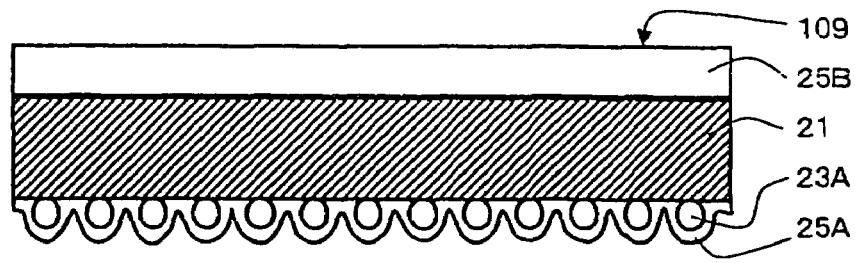
FIG. 4 is a sectional view for explaining the structure of a conductive layer.

FIG. 3(A) is a sectional view taken along the line A-A in FIG. 2. FIG. 3(B) is a sectional view taken along the line B-B in FIG. 2. FIG. 4 is a sectional view for explaining the structure of a conductive layer.

FIG. 3(A) is a sectional view taken along a line crossing the meshes 105 and the lines 107 alternately, FIG. 3(B) is a sectional view taken along a line longitudinally extending through the line 107 consisting of the conductive layer 109. The conductive layer 109 includes a metal layer 21. At least a surface, on the viewing side, of the metal layer 21 is treated by a blackening treatment. In this embodiment, the metal layer 21 has opposite surfaces 23A and 23B treated by a blackening treatment. The blackened surfaces 23A and 23B are coated with antirust layers 25A and 25B, respectively. The antirust layer may be formed at least on only the surface treated by the blackening treatment.

The antirust layers 25A and 25B prevent rusting of the metal layer 21 and the blackened surfaces 23A and 23B, and also prevent peeling off of the blackened surfaces 23A and 23B. The metal layer 21 is processed by an etching process to form a mesh structure in such a manner that parts, corresponding to the meshes 105, of the antirust layer 25A overlying the base sheet 11 are not etched off. Thus the antirust layer 25A is able to protect the base sheet 11 and the adhesive layer 13 from the etchant. Formation of the blackened surface 23B and the antirust layer 25B on the other surface of the metal layer 21 is optional. That is, formation of the blackened surfaces 23A and 23B and the antirust layers 25A and 25B on both the surfaces of the metal layer 21 is optional. In short, it is preferable to form the blackened surface and the antirust layer at least on a surface, on the viewing side, of the metal layer 21, and to coat the entire surface of the base sheet 11 (corresponding to the meshes and the lines) with the antirust layer 25A.

FEATURES OF THE INVENTION

The electromagnetic shielding sheet 1 of the present invention has the peripheral mesh part 104 extending between the mesh part 103 and the grounding frame 101. The line width W of straight parts of the lines 107 defining the meshes in the peripheral mesh part 104 gradually increases from the mesh part 103 toward the grounding frame 101. The region in which the peripheral mesh part 104 is formed corresponds to the length of an arrangement of one to fifty meshes or a length between about 0.15 and about 15 mm, preferably one to twenty-five meshes or a length between 0.3 and 7.5 mm, more preferably three to twenty meshes or a length between 1.5 and 6.0 mm, from the inner periphery of the grounding frame 101 toward the mesh part 103.

The line width increases continuously (see FIG. 6), or stepwise (see FIG. 1). Although the line width may be changed in a single step as shown in FIG. 1, it is preferable to change the line width in two or more steps in order to effectively avoid stress concentration.

Since the line width W of the lines 107 in the peripheral mesh part 104 gradually increases from the mesh part 103 toward the grounding frame 101, the rigidity gradually changes from the mesh part 103 toward the grounding frame 101. That is, the rigidity does not change sharply although the rigidity changes sharply in prior art. Thus the electromagnetic shielding sheet is very easy to handle in processes from a fabricating process of the electromagnetic shielding sheet to an assembling process for assembling the electromagnetic shielding sheet and the display. That is, bending and/or permanent bending of the electromagnetic shielding sheet is prevented, the breakage of the lines defining the meshes in the boundary region between the mesh part and the grounding frame is prevented, and expensive parts are not wasted.

The plasma display panel is characterized in capability of being formed in a large size. The size (external dimensions) of an electromagnetic shielding sheet for a 37-inch PDP is about 620 mm×about 830 mm, and the size of an electromagnetic shielding sheet for a 42-inch PDP is about 580 mm×about 980 mm. Some electromagnetic shielding sheets have greater sizes. Therefore, handling ease of the electromagnetic shielding sheet is very important in handling the electromagnetic shielding sheet in the processes including the fabricating process of the electromagnetic shielding sheet to the assembling process thereof to the display. In the conventional electromagnetic shielding sheet, the lines in the boundary region between the mesh part and the grounding frame of are often broken or bent, and hence expensive parts are wasted.

Although the electromagnetic shielding sheet of the present invention is described in this specification as applied to a display, such as a CRT or a PDP, the electromagnetic shielding sheet is applicable to shielding radiation of electromagnetic wave from devices other than displays.

(Summary of Fabricating Method)

A conductive layer 109 having a blackened surface and an antirust layer on at least one surface the viewing side is prepared. The conductive layer 109 is bonded to one surface of a base sheet 11, namely, a transparent film, by an adhesive layer 13. A resist film of a mesh pattern is formed on the conductive layer 109. Parts of the conductive layer 109 corresponding to meshes in the patterned resist film are removed by etching, and then the resist film is removed (photolithographic process).

The electromagnetic shielding sheet 1 in this embodiment can be fabricated by an etching system for etching a sheet to form a shadow mask or the like. Most steps of the electromagnetic-shielding-sheet fabricating process can be continuously carried out. Therefore, a high-quality electromagnetic shielding sheet can be produced at a high yield and at high production efficiency.

Materials and forming methods of the component layers of the electromagnetic shielding sheet 1 in this embodiment will be explained.

(Conductive Layer)

The metal layer 21 of the conductive layer 109 of the electromagnetic shielding sheet 1 in this embodiment has at least one surface treated by a blackening treatment. The blackened surfaces 23A and/or 23B are coated with the antirust layers 25A and/or 25B.

The conductive layer 109 is bonded to the base sheet 11, namely, a transparent film, with an adhesive, and then the conductive layer 109 is subjected to a photolithographic process to form a mesh pattern in the conductive layer 109. If necessary, the surface on the side of the metal layer is planarized. In addition, if necessary, a light absorber layer capable of absorbing visible light and/or near-infrared radiation having a specific wavelength is provided on the planarized surface of the conductive layer 109.

The electromagnetic shielding sheet having the conductive layer 109 is placed on the front surface of a display to suppress the radiation of electromagnetic wave generated by the display, has the uniformly arranged meshes, scarcely causes defects such as black or white spots and lines, is properly transparent, and is capable of ensuring the satisfactory visibility of images displayed by the display.

The metal layer 21 of the conductive layer 109 for suppressing the radiation of electromagnetic wave is a layer made of a metal having a conductivity sufficient for electromagnetic shielding, such as gold, silver, copper, iron, aluminum, nickel or chromium. The metal layer 21 may be formed of an alloy or may be of multilayer structure. Desirable ferrous metals for forming the metal layer 21 are low-carbon steels, such as low-carbon rimmed steels and low-carbon aluminum killed steels, and Ni—Fe alloys and Invar. If the metal layer 21 is formed by a cathodic deposition process, copper or a copper alloy foil is preferable because it is easy to be electro-deposited. The copper alloy foil may be a rolled copper foil or an electrolytic copper foil. The electrolytic copper foil is preferable from a viewpoint of thickness uniformity, adhesion to a blackened and/or chromated layer and formation of a thin foil of 10 μm or below in thickness.

The thickness of the metal layer 21 is within a range of about 1 to about 100 μm, preferably 5 to 20 μm. Although the meshes of the metal layer 21 can be more easily formed by the photolithographic process if the thickness of the metal layer 21 is lower than the lower limit of the foregoing thickness range, such a thin metal layer has an excessively high resistance, which affects adversely to electromagnetic shielding effect. If the thickness of the metal layer 21 is greater than the upper limit of the foregoing thickness range, the metal layer 21 cannot be processed in a desired mesh pattern of high definition. Consequently, actual opening ratio is reduced, light transmittance is reduced, viewing angle is reduced and hence the visibility of images is degraded.

Preferably, the surface roughness Rz of the metal layer 21 is between 0.5 to 10 μm. Surface roughness Rz is the mean of the roughnesses of ten points specified in B0601, JIS. If the surface roughness is smaller than the lower limit of the foregoing surface roughness range, the metal layer 21 will reflect external light in a specular reflection mode even if the surface of the metal layer 21 is blackened, and hence degrade the visibility of images. If the surface roughness of the metal layer 21 is greater than the upper limit of the foregoing surface roughness range, an adhesive and/or a resist may not be uniformly spread over the surface of the metal layer 21 and bubbles may be generated in the adhesive and/or the resist.

(Blackening Treatment)

The surface, on the viewing side, of the meshed conductive layer 109 is treated by a blackening treatment to absorb external light, such as sunlight and light emitted by fluorescent lamps, which falls on the surface of the electromagnetic shielding sheet 1, and to improve the visibility of images displayed by the display. The blackening treatment of the surface of the conductive layer 109 enhances the contrast of images.

The blackening treatment roughens or blackens the surface of the metal layer. More concretely, the blackening treatment deposits a metal oxide or a metal sulfide.

If the meshed conductive member 109 is formed of a ferrous material, the conductive member 109 is exposed to temperatures between about 450° C. and about 470° C. in steam for 10 to 20 min so as to form an oxide film (black film) of a thickness between about 1 to about 2 μm. The oxide film (black film) may be formed by a chemical treatment using concentrated nitric acid.

If the conductive layer 109 is a copper foil, it is preferable to treat the conductive layer 109 by a cathodic electrodeposition treatment for depositing cationic particles on the surface of the foil using an electrolyte containing sulfuric acid, copper sulfate and cobalt sulfate. The deposited cationic particles roughen and blacken the surface. Possible cationic particles are Cu particles and Cu alloy particles. Cu—Co alloy particles are preferable.

In this specification, antireflection treatments, such as roughening treatments and blackening treatments, of forming a light-absorbing layer on the surface of a conductive member to absorb light and to prevent reflection are referred to inclusively as blackening treatments.

Preferably, the black density of a surface treated by the blackening treatment is 0.6 or above. Black density of a test piece is measured by using GRETAG SPM100-11 (made by Kimoto Company, commercial name) included in COLOR CONTROL SYSTEM at a viewing angle of 10° using D50 as an observation light source, in an illumination type of "Density Standard ANSI T", after white calibration.

Preferably, the reflectance of a surface treated by the blackening treatment is 5% or below. Reflectance is measured by a method specified in K7 105, JIS, using a Hazemeter HM150 (made by Murakami Sikisai Company, commercial name).

(Alloy Particles)

The cationic particles may be Cu particles and Cu alloy particles. Cu—Co alloy particles are preferable.

When the Cu—Co alloy particles are used, the level of blackening is remarkably improved so that visible light is satisfactorily absorbed. Color tone as an optical characteristic for evaluating the visibility of the electromagnetic shielding sheet is expressed by a calorimetric system "L*, a*, b*, ΔE*" specified in Z8729, JIS. When the respective absolute values of "a*" and "b*" are small, the conductive layer 109 is not visible, so that the contrast of the images enhances and, consequently, the images have an excellent visibility. When the Cu—Co alloy particles are used, values of "a*" and "b*" are substantially equal to zero, as compared with those when the Cu particles are used.

Preferably, the mean particle size of Cu—Co alloy particles is within a range of 0.1 to 1 μm. When Cu—Co alloy particles having a mean particle size greater than the upper limit of the foregoing range are formed, the metal layer 21, namely, a metal foil, becomes excessively thin, so that the metal layer 21 may be broken in a process of attaching the metal layer 21 to the base sheet 11 to deteriorate workability, and the density of the particles decreases, so that the irregularity of the density of the particles becomes conspicuous. On the other hand, when Cu—Co alloy particles having a mean particle size smaller than the lower limit of the foregoing range are formed on the surface, the surface is insufficiently rough, that is, the surface has an insufficient effect on preventing the reflection of external light by light absorption, and hence the visibility of images are deteriorated.

(Antirust Layer)

At least the metal foil surface including the blackened surfaces is coated with the antirust layers 25A and/or 25B in order to prevent the metal layer 21 and/or the blackened surfaces 23A, 23B from rusting, from peeling off and from deformation. The antirust layers 25A and 25B may be made of an oxide of Ni, Zn and/or copper or may be layers formed by a chromate treatment. The oxide of Ni, Zn and/or copper may be formed by known plating processes. The thickness of the antirust layers 25A and 25B is between about 0.001 and about 1 μm, preferably, between 0.001 and 0.1 μm.

(Chromate Treatment)

The chromate treatment treats a target workpiece with a chromating solution. A surface of the workpiece can be wetted with the chromating solution by a roll coating method, a curtain coating method, a squeeze coating method, an electrostatic atomization method, an immersion method, and so on. The workpiece treated by the chromate treatment may be dried without being washed. For example, when it is desired to treat one surface of a workpiece by a chromate treatment, a chromating solution is applied to the surface of the workpiece by a roll coating method or the like. When it is desired to treat both surfaces of a workpiece, the workpiece is immersed in a chromating solution by an immersion method. Usually, a chromating solution containing 3 g/l $CrO_2$ is used for a chromate treatment. Another chromating solution for a chromate treatment may be prepared by mixing an oxycarboxylic acid compound into an aqueous chromic anhydride solution and reducing part of hexavalent chromium into trivalent chromium.

The color of a chromated surface is between light yellow and yellowish brown depending on the amount of hexavalent chromium deposited on the chromated surface. Trivalent chromium is colorless. Thus, a chromated surface having practically acceptable transparency can be formed by properly controlling the respective amounts of trivalent chromium and hexavalent chromium.

Possible oxycarboxylic acid compounds are tartaric acid, malonic acid, citric acid, lactic acid, glycolic acid, glyceric acid, tropic acid, benzilic acid and hydroxyvaleric acid. Those compounds may be used individually or in combination. Since different compounds have different reducing abilities, respectively, the concentration of each compound is determined taking into consideration its ability to reduce hexavalent chromium into trivalent chromium.

More concretely, ALSURF 1000 (made by Nippon Paint Company, commercial name of a chromating agent) or PM-284 (made by Nippon Parkerizing Company, commercial name of a chromating agent) or the like may be used. The chromate treatment applied to a blackened surface (layer) also has a blackening enhancing effect in addition to an antirust effect.

The blackened surface and the antirust layer facing the viewing side can improve the contrast and the visibility of images displayed by the display. On the other hand, the blackened surface and the antirust layer facing the display can suppress stray light rays emitted by the display and hence improve the visibility of images.

(Base Sheet)

Various materials can be used for forming the base sheet 11, provided that the materials have a level of transparency, an insulating property, a level of heat resistance and a mechanical strength meeting conditions for use and fabrication. For example, possible materials for forming the base sheet 11 are polyester resins, such as polyethylene terephthalate resins, polybutylene terephthalate resins, polyethylene naphthalate resins, polyethylene terephthalate-isophthalate copolymers and terephthalic acid-cyclohexandimethanol-ethylene glycol copolymers, co-extruded film of polyethylene terephthalate/polyethylene naphthalate; polyamide resins, such as nylon 6, nylon 66 and nylon 610; polyolefin resins, such as polypropylene resins and poly(methyl pentene) resins; vinyl resins, such as polyvinyl chloride resins; acrylic resins, such as polyacrylate resins, polymethacrylate resins and poly(methyl methacrylate) resins; imide resins, such as polyimide resins, polyamide-imide resins and poly(ether imide) resins; engineering resins, such as polyacrylate resins, polysulfone resins, poly (ether sulfone) resins, polyphenylene ether resins, polyphenylene sulfide resins (PPSs), polyaramid resins, poly(ether ketone) resins, poly(ether nitrile) resins, poly(ether ether ketone) resins and poly(ether sulfite) resins; and styrene resins, such as polycarbonate resins and polystyrene resins.

The base sheet 11 may be formed of a copolymer containing the foregoing resin as a principal component, or formed of one of mixtures of the foregoing resins including alloys. The base sheet 11 may be a laminated film. Although the base sheet 11 may be either a stretched film or an unstretched film, it is preferable that the base sheet 11 is a uniaxially stretched or biaxially stretched film in view of strength. Usually, the thickness of the base sheet 11 is between about 12 and about 1000 µm, preferably between 50 and 700 µm, more preferably between 100 and 500 µm. Base sheets having a thickness below the lower limit of the foregoing thickness range have insufficient mechanical strength, so that they may warp and slacken. Base sheets having a thickness greater than the upper limit of the foregoing thickness range have excessive abilities costly.

The base sheet 11 is a film, a sheet or a board made of at least one of those resins. In this specification, films, sheets and boards are referred to inclusively as film. Generally, a polyester film such as a polyethylene terephthalate resin or a polyethylene naphthalate resin is used because the polyester film has high transparency and high heat resistance and is inexpensive. Polyethylene terephthalate resins are optimum. Higher transparency is desirable. Preferably, the base sheet 11 has a visible-light transmittance of 80% or above.

The surface of the base sheet to which an adhesive is to be applied may be processed by a bond performance enhancing process to enhance the bond performance of the surface. Possible bond performance enhancing processes are corona discharge treatments, plasma treatments, ozone treatments, flame treatments, primer application processes for applying a primer, such as an anchoring agent, an adhesion promoting agent or an adhesion enhancing agent, to the surface of the base sheet, preheating processes, dusting processes, deposition processes, alkali treatments, and so on. The resin film may contain some of additives including a filler, a plasticizer and an antistatic agent, when necessary.

(Laminating Method)

A laminating method of laminating the base sheet 11 and the conductive layer 109 applies an adhesive or a pressure-sensitive adhesive to either of the base sheet 11 and the conductive layer 109 or to both the base sheet 11 and the conductive layer 109, dries the adhesive or the pressure-sensitive adhesive when necessary, and compresses the base sheet 11 and the conductive layer 109 to each other under heat or not under heat to form a laminated structure. When necessary, the laminated structure is then subjected to aging at temperatures between 30 and 80° C. If the base sheet 11 or the joining layer of the base sheet 11 when the base sheet 11 is a multilayer sheet is formed of a heat-adhesive resin, such as an ionomer, an ethylene-vinyl acetate copolymer or an ethylene-acrylicacid copolymer, ethylene-acrylicacidester copolymer, the adhesive layer 13 may be omitted, and the superposed base sheet 11 and conductive layer 109 need only to be compressed under heat.

The adhesive layer 13 may be omitted and the conductive layer 109 may be formed directly on the base sheet 11 by electroless plating, by both electroplating and electroplating or by vapor deposition.

(Adhesive)

There are not particular restrictions on the adhesive. Suitable adhesives are, for example, acrylic resins, polyester resins, urethane resins, vinyl chloride-vinyl acetate copolymer resins. The dry lamination method so called by persons with ordinary skill in the art is a preferable laminating method. The dry lamination method uses, as an adhesive, a thermosetting resin resistant to the coloring and deteriorating effects of an etchant and having good workability. It is also preferable to use a UV-curing resin that can be cured by ionizing radiation, such as UV radiation.

(Dry Lamination Method)

The dry lamination method forms a laminated structure by laminating two sheets by the steps of applying an adhesive solution prepared by dispersing or dissolving an adhesive in a solvent to surfaces of sheets, drying the adhesive solution applied to the sheets, laminating the sheets in a laminated structure, and aging the laminated structure at temperatures between 30 and 120° C. for time period between several hours and several days to cure the adhesive.

A nonsolvent lamination method developed by improving the dry lamination method may be also used. The nonsolvent lamination method forms a laminated structure by the steps of laminating two sheets having surfaces coated respectively with adhesive layers formed by applying an adhesive to the surfaces and drying the same, and aging the laminated structure at temperatures between 30 and 120° C. for time period between several hours and several days to cure the adhesive Suitable adhesives for the dry lamination method and the nonsolvent lamination method are those that can be cured by heat or ionizing radiation, such as UV radiation or electron beams. More concretely, possible thermosetting adhesives are two-part adhesives, such as urethane adhesives respectively containing, for example, acryl-urethane resins, polyester-urethane resins and polyether-urethane resins, acrylic adhesives, polyester adhesives, polyamide adhesives, polyvinyl acetate adhesives, epoxy adhesives and elastomeric adhesives. Two-part urethane adhesives are suitable.

A polymer produced by the interaction of, for example, a polyfunctional isocyanate resin and a hydroxyl compound (polyol) is used as a two-part urethane adhesive. More concretely, possible polyfunctional isocyanates are aromatic polyisocyanates, such as tolylene diisocyanate, diphenylmethane diisocyanate and polymethylene-polyphenylene polyisocyanate, or aliphatic (or alicyclic) polyisocyanates, such as hexamethylene diisocyanate, xylylene diisocyanate and isophorone diisocyanate. Those polyisocyanates may be polymers (trimers) or the like of the aforesaid isocyanates. Possible hydroxyl compounds are polyether polyols, polyester polyols and polyacrylate polyols. A two-part urethane resin produced by the interaction of the polyfunctional isocyanate and the hydroxyl compound can be used.

An adhesive prepared by blending polyester polyurethane modified by a styrene-maleic acid copolymer and an aliphatic polyisocyanate is preferable. This adhesive is resistant to the coloring and deteriorating effects of an etchant.

The dry lamination method dissolves or disperses a composite adhesive containing the foregoing substances as principal components in an organic solvent to prepare an adhesive solution, applies the adhesive solution to the base sheet by a coating method, such as a roll coating method, a reverse roll coating method, a gravure coating method, a gravure reverse coating method, gravure offset coating method, a kiss coating method, a wire bar coating method, a comma coating method, a knife coating method, a dip coating method, a flow coating method and a spray coating method, and forms an adhesive layer for lamination by drying the adhesive solution applied to the base sheet to remove the solvent. A roll coating method or a reverse roll coating method is preferable.

The thickness of the adhesive layer as dried is between about 0.1 and about 20 μm, preferably, between 1 and 10 μm. The base sheet and the conductive layer are laminated, and the adhesive is cured by aging at temperatures between 30 and 120° C. for a time period between several hours and several days to bond the base sheet and the conductive layer together. The adhesive layer may be formed on the surface of either the base sheet or the conductive layer. Preferably, the adhesive layer is formed on the roughened surface of the copper foil. In the case, the adhesive is able to spread over the entire roughened surface and the formation of bubbles in the adhesive layer is prevented.

Basically, the nonsolvent lamination method is similar to the dry lamination method. The nonsolvent lamination method uses a composite adhesive itself, instead of an adhesive solution prepared by dissolving or dispersing a composite adhesive in a solvent. When necessary, a composite adhesive is heated to decrease the viscosity of the composite adhesive.

(Pressure-Sensitive Adhesive)

A generally known pressure-sensitive adhesive may be used. Possible pressure-sensitive adhesives include natural rubber adhesives, synthetic rubber adhesives, such as butyl rubber adhesives, polyisoprene adhesives, polyisobutylene adhesives, polychloroprene adhesives and styrene-butadiene copolymers; silicone resins, such as dimethyl polysiloxane resins; acrylic resins; vinyl acetate resins, such as polyvinyl acetate resins and ethylene-vinyl acetate copolymers; urethane resins; acrylonitrile resins; hydrocarbon resins; alkylphenol resins; and rosin resins, such as rosins, rosin triglyceride resins and hydrogenated rosins.

(Pressure-Sensitive Rubber Adhesives)

An effective pressure-sensitive rubber adhesive is a blend of one or some of pressure-sensitive rubbers, such as chloroprene rubbers, nitrile butadiene rubbers, acrylic elastomers, styrene-butadiene rubbers, styrene-isoprene-styrene rubbers, styrene-butadiene-styrene rubbers, styrene-ethylene-butadiene-styrene rubbers, butyl rubbers, polyisobutylene rubbers, natural rubbers and polyisoprene rubbers, and one or some of tackifiers, such as phenol resins, modified phenol resins, ketone resins, alkyd resins, rosin resins, coumarone resins, styrene resins, petroleum resins and vinyl chloride resins.

Pressure-sensitive rubber adhesives, as compared with acrylic adhesives, are excellent in chemical resistance, swelling resistance, temperature resistance, adhesion and peeling resistance. Therefore, the laminated structure will not be delaminated even if the laminated structure is exposed to an acid substance or an alkaline substance. The pressure-sensitive rubber adhesive scarcely causes its hydrolysis and maintains its adhesion for a long time even if the pressure-sensitive rubber adhesive is immersed in an acid or alkaline solution.

(Formation of Pressure-Sensitive Adhesive Layer)

An adhesive liquid, i.e., latex, a water dispersion or an organic solvent solution of the foregoing resin or a blend of the foregoing resins, is applied to one of sheets to be laminated by a known printing or coating method, such as a screen printing method or a comma coating method. The sheet is subjected to a drying process, when necessary, and the sheet and the other sheet are superposed and compressed.

(Use of Sheet Roll)

Figure 5A:
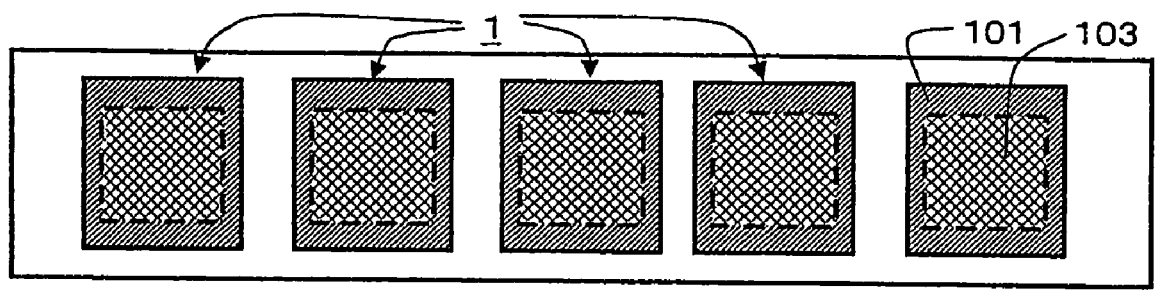
FIGS. 5(A) and 5(B) are a plan view and a side elevation, respectively, of assistance in explaining processing a sheet unwound from a sheet roll.
Figure 5B:
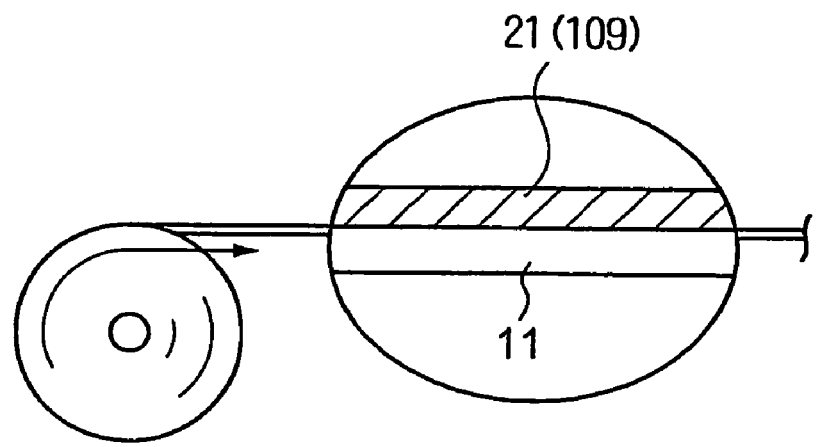

FIGS. 5(A) and 5(B) are a plan view and a side elevation, respectively, of assistance in explaining a process of a sheet unwound from a sheet roll. As shown in a plan view of FIG. 5(A), electromagnetic shielding sheets 1 are arranged at fixed intervals on a sheet unwound from a sheet roll. As shown in a side elevation of FIG. 5(B), the conductive layer 109 is laminated to the base sheet 11.

The blackened surface and the antirust layer are formed on the conductive layer 109 unwound from the sheet roll. The adhesive is applied to the antirust layer as an adhesive layer, the adhesive layer is dried, the conductive layer 109 is placed on the base sheet 11, and the conductive layer 109 and the base sheet 11 are compressed to form a laminated structure. When necessary, the laminated structure is aged in an atmosphere of a temperature in a range of 30 to 80° C. for a time period between several hours and several days. The sheet having thus formed laminated structures is rolled again.

(Photolithographic Process)

The laminated structure is subjected to a photolithographic process, which forms a resist layer of a mesh pattern on the surface of the conductive layer of the laminated structure, etches off parts of the conductive layer corresponding to the meshes of the resist layer, and then removes the resist layer. Thus a mesh conductive layer is formed.

Thus the conductive layer 109 of the laminated structure consisting of the base sheet 11 and the conductive layer 109 is etched in a mesh pattern by the photolithographic process. The laminated structure is unwound from a roll of the laminated structure and then sent to the photolithographic process. The laminated structure is stretched taut, and is subjected to masking, etching and resist removing steps while the same is conveyed continuously or intermittently.

(Masking Step)

For example, a photoresist is applied to the conductive layer 109 as a photoresist film, the photoresist film is dried, the photoresist film is exposed through a photomask of a predetermined mesh pattern (having lines defining meshes) by a contact printing method, and the exposed photoresist film is successively subjected to developing, hardening and baking to form a mask.

A resist, such as casein, PVA or gelatin, is applied to the surface of the conductive layer 109 of the stretched laminated structure (formed by laminating the base sheet 11 and the conductive layer 109) by a dipping method, a curtain coating method or a pouring method while the laminated structure is conveyed continuously or intermittently. A dry resist film may be used instead of the resist film formed by the foregoing wet process. Use of a dry resist film facilitates work. The resist film is baked at a temperature between 200 and 300° C. if the resist film is formed of casein. It is preferable to bake the resist film at the lowest permissible temperature to prevent warping of the laminated structure.

(Etching Step)

Then, the conductive layer 109 is etched after the masking step. The present invention performs etching continuously. Therefore, it is preferable to use, as an etchant, a ferric chloride solution or a cupric chloride solution which can be easily used in circulation. The etching step is substantially the same as a shadow-mask fabricating step that etches a continuous thin sheet of a thickness between 20 and 80 µm to fabricate shadow masks for CRTs for color TV receivers. Thus, the etching step can be carried out by an existing shadow-mask fabricating system. The shadow mask fabricating system can continuously and efficiently carry out all the necessary steps from a masking step to an etching step. The etched laminated structure is washed by water, the resist film is removed by using an alkaline solution, and the laminated structure is subjected to washing and then drying.

(Mesh)

The mesh part 103 has the many meshes (openings) 105 defined by the lines 107. There are not particular restrictions on the shape of the meshes 105. For example, the shape of the meshes 105 may be a triangle, such as an equilateral triangle or an isosceles triangle, a quadrangle, such as a square, a rectangle, a rhombus or a trapezoid, a polygon, such as a pentagon, a hexagon or an octagon, a circle, an ellipse, and so on. The meshes 105 are arranged in a mesh pattern.

In view of opening ratio, invisibility of the mesh part and visibility of the images, the line width W of the lines 107 in the mesh part 103 must be within a predetermined value ±30%. The radius of curvature of a side wall extending between the upper and the lower side of a section of each of the lines 107 in a plane perpendicular to the transparent base sheet 11 must be in the range of 1.5 to 3.0 times the thickness of the conductive layer 109. Preferably, the line width W of the lines 107 in the mesh part 103 is a fixed value between 5 and 25 µm, and the pitches of the lines 107 in the mesh part 103 is a fixed value between 150 and 500 µm. The line width W of the lines 107 in the peripheral mesh part 104 surrounding the mesh part 103 and corresponding to one to fifty meshes or 0.15 to 15 mm gradually increases toward the grounding frame 101.

Generally, an electromagnetic shielding sheet for a large plasma display panel has more than several thousands intersecting straight lines. As unevenness of the line width of the lines is suppressed and the radius of curvature of a side wall of extending between the upper and the lower side of a section of each of the lines is regulated, the electromagnetic shielding sheet 1 thus fabricated can have, in addition to an electromagnetic shielding ability and proper transparency, meshes arranged in a uniform density, and few defects, such as black and white spots and lines, and is capable of suppressing the glaring of the screen of the display and the reflection of external light. That is, the electromagnetic shielding sheet 1 can achieve good visibility of the images.

When the desired line width is 14 µm, the respective line widths of the lines may be limited in the width range of 14±4.2 µm, i.e., in the width range of 9.8 to 18.2 µm. When the lines are formed in such a width range, the meshes are arranged in a uniform density and the electromagnetic shielding sheet 1 has few defects, such as black and/or white spots and lines. If the respective line widths of the lines are distributed in an excessively wide width range, the meshes can be recognized as a uniform density. In addition, when he or she watches the images displayed by the display, parts of the lines having excessively wide line widths are defective and appear as black spots, and parts of the lines having excessively narrow line widths are defective and form white spots. Images having white and/or black spots evoke a very strong feeling of wrongness in persons.

The electromagnetic shielding sheet in this embodiment fabricated by a continuous photolithographic process has the lines of line widths in the desired width range and hence has the meshes arranged scarcely in an irregular density, as well as does not have any problem in electromagnetic shielding ability and transparency. Irregular mesh distribution and defects, such as black and/or white spots and lines, can be caused by the adhesion of drops of splashed liquid resist to undesired parts of the conductive layer when the liquid resist is applied to the surface of the conductive layer. Such a trouble rarely occurs in the continuous photolithographic process.

The line widths of the lines in the mesh part 103 and the peripheral mesh part 104 are controlled in different control modes. The line width W of the straight parts of the lines 107 in the peripheral mesh part 104 is increased gradually toward the grounding frame 101.

The peripheral mesh part 104 extends between the mesh part 103 and the grounding frame 101 so as to surround the mesh part 103. The width of the peripheral mesh part 104, i.e., the distance between the inner side of the grounding frame 101 and the corresponding side of the mesh part 103, corresponds to one to fifty meshes or about 0.15 to about 15 mm, preferably one to twenty-five meshes or 0.3 to 7.5 mm, more preferably three to twenty meshes or 1.5 to 6.0 mm.

If the width of the peripheral mesh part 104 is greater than the upper limit of the foregoing width range, a dark frame is visible in a peripheral area of the display, the images look small, and the visibility of the images is deteriorated. If the width of the peripheral mesh part 104 is smaller than the lower limit of the foregoing width range, the rigidity of the mesh lines changes excessively abruptly and the lines can be bent. The line width may be changed either continuously and gradually across a plurality of the meshes 105 (cells) or stepwise such that the line width changes every mesh 105 (cell).

Figure 6:
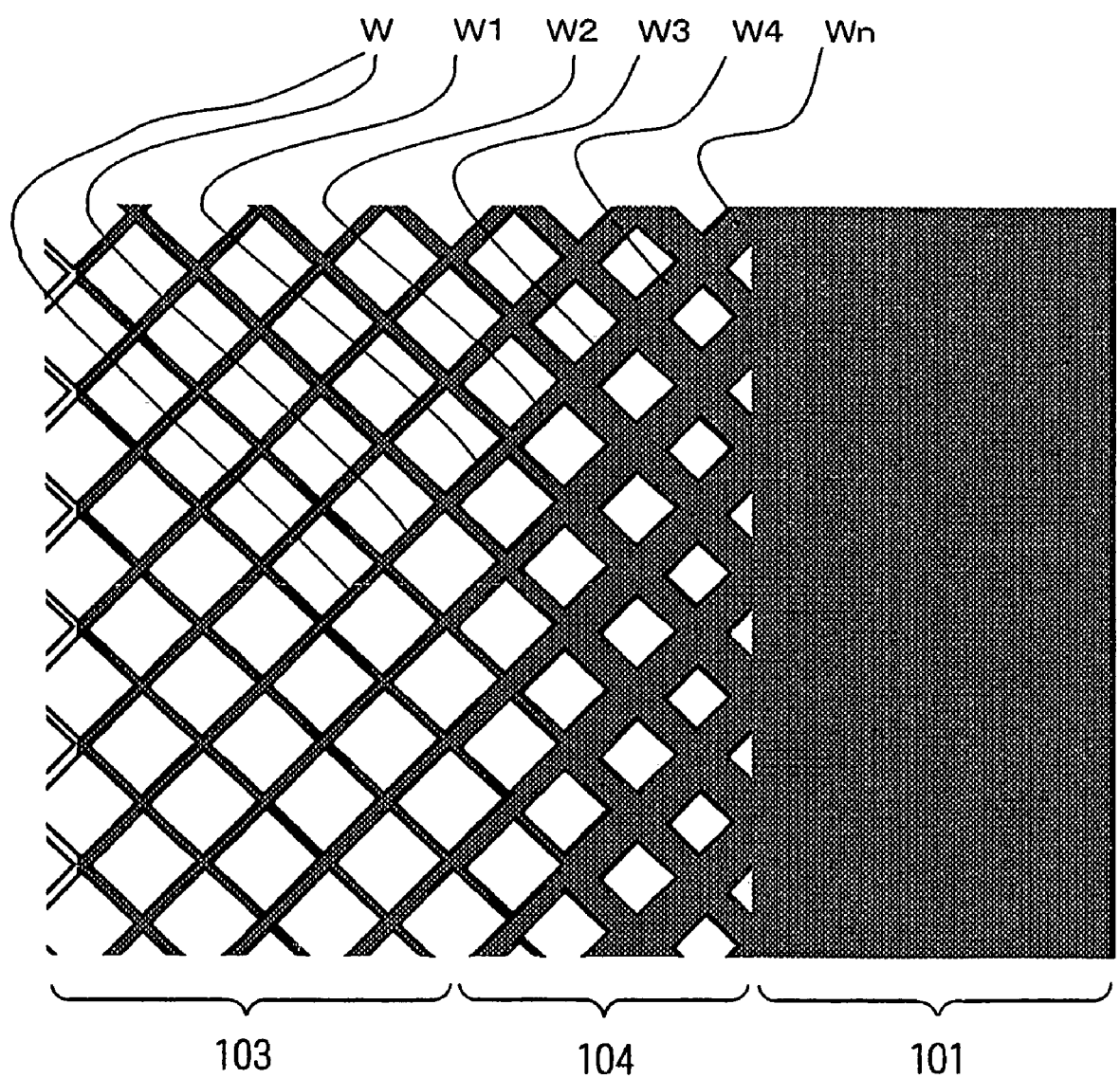
FIG. 6 is an enlarged, fragmentary plan view of the peripheral mesh part of the electromagnetic shielding sheet in the preferred embodiment.

FIG. 6 is an enlarged, fragmentary plan view of the peripheral mesh part 104 included in the electromagnetic shielding sheet in the preferred embodiment.

The lines 107 of the mesh part 103 has the predetermined line width W. Each of the lines 107 in the peripheral mesh part 104 has parts having line widths W1, W2, W3, . . . , Wi, . . . and Wn, toward the grounding frame 101. These line widths meet relation expressed by: W<W1<W2<W3< . . . <Wi< . . . <Wn.

When the line width of the lines 107 changes continuously, the line width increases continuously from W1 toward Wn; that is, the line width Wi (i=1, 2, . . . , n) of a part of the line 107 corresponding to one cell increases gradually in itself.

When the line width of the lines 107 changes stepwise, the line width Wi of a part of the line 107 corresponding to one cell is fixed in itself. The number n of steps of change of the line width is at least one and it is preferable that the number n is not less than two to distribute stress induced in the edges of the mesh part 103 stepwise to avoid stress concentration.

In the example shown in FIG. 6, n=5 and the line width is increased stepwise. The respective line widths of all the lines do not need to be changed in the same line width changing mode, and the different lines may have different line widths W1, W2, W3, . . . and Wn, respectively.

The lines having gradually increasing line width can be formed by exposing a dry resist film attached to the conductive layer 109 or a photoresist film formed by applying a photoresist to the conductive layer 109 through a photomask having a desired pattern defining such lines. The photomask corresponds to a film called a plate-forming film by persons having ordinary skill in the art. A plate-forming film having opaque parts corresponding to the meshes 105 and transparent parts corresponding to the lines 107, i.e., a film having a negative image of the lines 107, is used when the resist film is a negative photoresist film, in which exposed parts hardens and become insoluble. A plate-forming film having a positive image of the lines 107 is used when the resist film is a positive photoresist film, in which unexposed parts become insoluble. Parts of the photomask corresponding to the lines 107 in the mesh part 103 are formed in the predetermined line width W. The line width of parts of the photomask corresponding to the lines 107 in the peripheral mesh part 104 is changed toward the grounding frame 101 from W1 to Wn, where W<W1<W2<W3< . . . <Wn.

In the electromagnetic shielding sheet shown in FIG. 1, the lines are inclined at an inclination of 45° to the lower edge of the electromagnetic shielding sheet. The inclination of the lines may be properly selectively determined taking into consideration the pixels and the light emitting characteristics of the display to prevent the occurrence of moire.

(Planarization)

Parts of the conductive layer 109 corresponding to the lines 107 defining the meshes has a thickness equal to that of the conductive layer, and parts of the conductive layer 109 corresponding to the meshes 105 are hollows. Thus the conductive layer 109 has an irregular surface. When an adhesive or a pressure-sensitive adhesive, which will be referred to inclusively as "adhesive", is applied to the conductive layer 109 in the next process, the hollows are filled up with the adhesive. However, bubbles are liable to be contained in the adhesive filling up the hollows. If bubbles are contained in the adhesive, light is scattered by the interface between the adhesive and the bubbles, and consequently haze (degree of cloudiness) increases. It is preferable to planarize the conductive layer by filling up the hollows with a transparent resin prior to the application of the adhesive to the conductive layer 109, in order to avoid the above problem.

The hollows are filled up with the transparent resin for the planarization. The transparency of the electromagnetic shielding sheet is deteriorated by bubbles remaining in the hollows unless the hollows are filled up completely with the transparent resin. Thus, a resin solution prepared by dissolving the transparent resin in a solvent and having a low viscosity is applied to the conductive layer 109, and then the resin solution is dried. Alternatively, the transparent resin is applied to the conductive layer 109 while the transparent resin is being deaerated. Thus a planarization layer 29 is formed (See FIG. 3 or 7).

It is preferable that the planarization layer 29 is highly transparent, and highly adhesive to the meshed conductive layer 109 and to an adhesive to be applied to the planarization layer 29 at the next process. It is not preferable that the surface of the planarization layer 29 has projections, depressions and/or irregularities. If the surface of the planarization layer 29 has projections, depressions and/or irregularities, moire, interference fringes and/or Newton's ring may appear when the electromagnetic shielding sheet 1 is placed on or above the front surface of the display. A preferable method of forming the planarization layer 29 applies a resin, such as a thermosetting resin or a UV-curable resin, to the conductive layer 109 in a resin film, laminates a releasable sheet having an excellent flatness to the surface of the resin layer, heats or irradiates with UV rays the resin film for curing, and then removes the releasable sheet from the cured resin film. The flat configuration of the flat releasable sheet is transferred to the surface of the planarization layer 29. Consequently, the planarization layer 29 can have a flat, smooth surface.

The planarization layer 29 may be formed of any suitable resin, such as a natural or synthetic resin or a thermosetting or an ionizing-radiation-curable resin. In view of durability, ease of application, ease of spreading in a flat film and capability of forming a flat surface, Acrylic UV-curable resins are suitable for forming the planarization layer 29.

(NIR-Absorbing Agent)

The resin forming the planarization layer 29 may contain a light-absorbing agent capable of absorbing visible radiation and/or near-infrared radiation of specific wavelengths. Absorption of the visible radiation and/or the near-infrared radiation suppresses unpleasant sensation and improves the visibility of the images. The near-infrared specific wavelengths are between about 780 and about 1200 nm, particularly between about 800 to about 1100 nm. Desirably, at least 80% of the near-infrared radiation of the wavelengths between 780 and 1200 nm is absorbed.

Any suitable near-infrared-absorbing agent (NIR-absorbing agent) may be used. For example, suitable NIR-absorbing agents are coloring matters having a sharp absorption peak in a near-infrared region in an absorption spectrum and a high transmittance for visible radiation in a wavelength region between 380 and 780 nm, and not having high absorbing ability for specific wavelengths in the visible region.

Visible radiation emitted from a PDP includes a large amount of orange light which corresponds to emission spectrum of neon atoms. Therefore, images displayed by the PDP have an orangy tinge as compared with natural color. Therefore, it is preferable to add a color-correcting absorbing agent capable of absorbing light of wavelengths in the range of about 570 to about 605 nm to the resin forming the planarization layer 29.

Suitable NIR-absorbing agents include cyanine compounds, phthalocyanine compounds, naphthalocyanine compounds, naphthoquinone compounds, anthraquinone compounds, dithiol complexes, immonium compounds and diimmonium compounds.

Suitable color-correcting absorbing agents include phthalocyanine compounds.

(NIR-Absorbing Layer)

The electromagnetic shielding sheet 1 may be provided with another layer (NIR-absorbing layer) containing an NIR-absorbing agent on at least one surface thereof, instead of adding an NIR-absorbing agent in the planarizing layer 29.

The NIR-absorbing layer may be formed on the planarization layer 29 and/or the surface of the base sheet 11 not facing the planarization layer 29. In FIG. 3, an NIR-absorbing layer 31B is formed on the planarization layer 29 and an NIR-absorbing layer 31A is formed on the exposed surface of the base sheet 11. The NIR-absorbing layers 31A and 31B are laminated and adhesively bonded films containing an NIR-absorbing agent and available on the market, such as No. 2832 made by Toyobo company, or layers formed by spreading a binder containing an NIR-absorbing agent. Suitable binders include polyester resins, polyurethane resins, acrylic resins and thermosetting or UV-curable resins respectively using the reaction of epoxy groups, acrylate groups, methacrylate groups and isocyanate groups for hardening. A color-correcting light absorber layer may be separately formed instead of forming the planarization layer 29 of a resin containing a color-correcting light absorbing agent.

(AR Layer)

An antireflection layer (AR layer), not shown, may be formed on the surface of the electromagnetic shielding sheet on the viewing side. The AR layer reduces the reflection of visible light. Various single and multilayer AR films are commercially available. The multilayer AR film is formed by alternately laminating highly refractive layers and low refractive layers. Possible highly refractive layers are those of niobium oxide, titanium oxide, zirconium oxide and ITO. Possible low refractive layers are those of silicon dioxide and magnesium fluoride. The AR layer may be such as having a surface having minute irregularities and capable of irregularly reflecting external light.

(Hard Coating Layer, Stainproof Layer, Antiglare Layer)

The electromagnetic shielding sheet may be provided with a hard coating layer, a stainproof layer and an antiglare layer in addition to the AR layer. The hard coating layer has a hardness of H or above determined by a pencil hardness test method specified in K5400, JIS. The hard coating layer may be a layer formed by hardening a layer of a polyfunctional acrylate resin, such as a polyester acrylate resin, a urethane acrylate resin or an epoxy acrylate resin, with heat or ionizing radiation. The stainproof layer is a water-repellent, oil-repellent layer. Possible materials for forming the stainproof layer are siloxane compounds and fluorinated alkylsilyl compounds. The antiglare layer has a surface provided with minute irregularities and capable of irregularly reflecting external light.

(Sheet Formation)

A continuous laminated strip thus fabricated is cut into electromagnetic shielding sheets 1. The electromagnetic shielding sheet 1 is attached to a transparent base plate, such as a glass plate. When necessary, an NIR-absorbing layer, an AR layer, a hard coating layer, a stainproof layer and an antiglare layer are combined with the electromagnetic shielding sheet 1 to form a front plate for a display.

A plate having a thickness between 1 and 10 mm and a sufficient rigidity is used as the base plate for a large display. A plastic film of a thickness between 0.01 and 0.5 mm is used as the base plate for a small display, such as a character display. Specifications of the base plate are properly selectively determined according to the size and uses of a display to which the base plate is to be applied. A front plate including the electromagnetic shielding sheet 1 is placed on the front surface of a display with the base sheet 11 facing the viewing side. Alternatively, the electromagnetic shielding sheet 1 may be directly attached to the front surface of a display.

(Direct Attachment)

Figure 7:
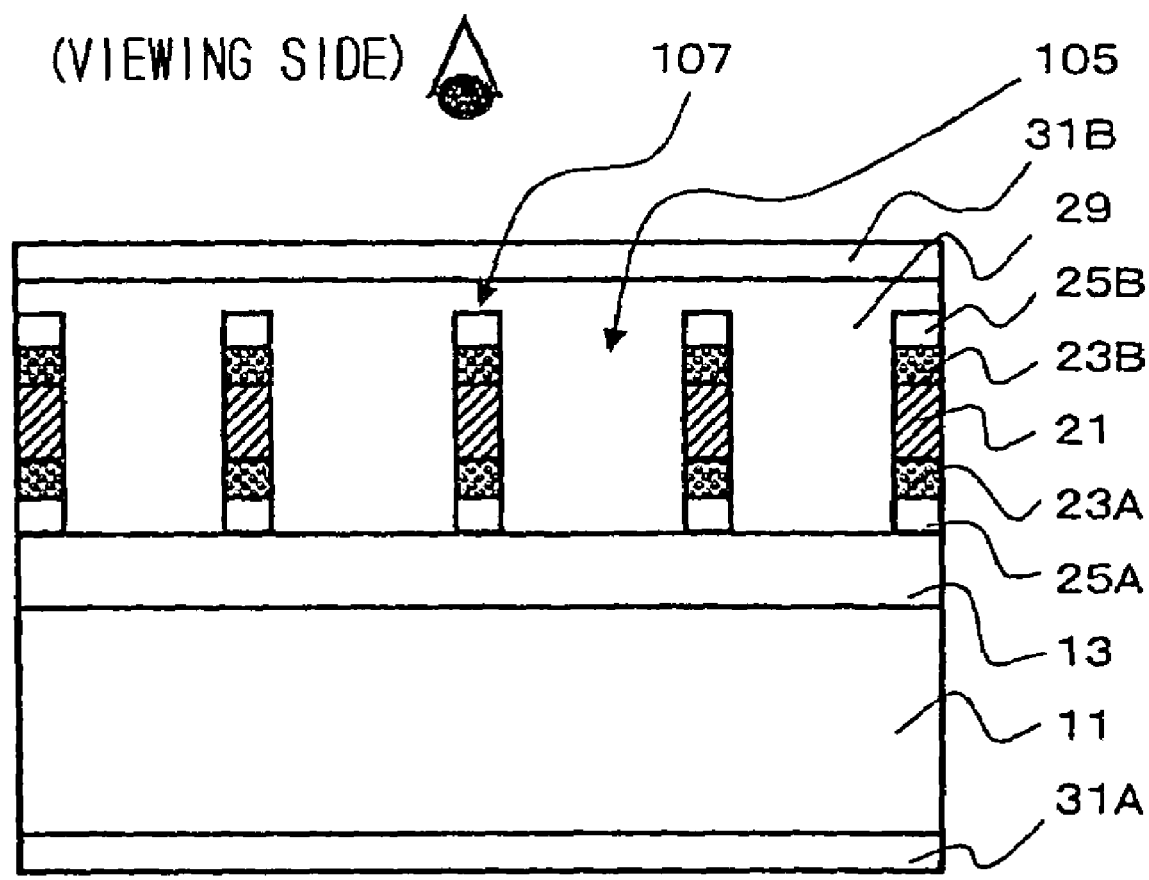
FIG. 7 is a sectional view of the electromagnetic shielding sheet in the preferred embodiment as attached to the surface of a display.

FIG. 7 shows an electromagnetic shielding sheet of the present invention to be attached to the front surface of a display in a sectional view. A mesh metal foil is on the viewing side. A blackened surface and an antirust layer are formed in that order on each of the opposite surfaces of the metal foil. Since a grounding frame 101 included in the electromagnetic shielding sheet is exposed, the grounding frame can be easily connected to a ground. Since the blackened surface of the grounding frame 101 faces the viewing side, a printing process for printing a black frame on a front glass plate can be omitted, which reduces the number of processes and is advantageous in respect of cost.

EXAMPLE 1

A 10 μm thick electrolytic metal foil having surfaces treated by a blackening treatment using Cu—Co alloy particles having a mean particle size of 0.3 μm, and treated by a chromate treatment for forming antirust blackened layers was used as a conductive layer. The conductive layer was laminated to a 100 μm thick biaxially stretched polyethylene terephthalate film (PET film) A4300 (made by Toyobo Company, commercial name) with the chromated layer bonded to the PET film with an adhesive layer of a two-part polyurethane adhesive to form a laminated structure. Then, the laminated structure was aged at 56° C. for four days. The two-part adhesive had a polyol (Takerakku A-310, made by Takeda Yakuhin Kogyo Company) as a resin, and a polyisocyanate as an accelerator (A-10, made by Takeda Yakuhin Kogyo Company). The thickness of the adhesive layer as dried was 7 μm.

Meshes were formed in a continuous strip by a photolithographic process including steps from a masking step to an etching step, by means of an existing manufacture line of a shadow-mask for a color TV. A casein layer, namely, a photoresist layer, was formed on the entire surface of the conductive layer by a pouring method, the conductive layer was carried to the next station, and the casein layer was subjected to contact exposure using a photomask and a high-pressure mercury lamp. Then, the conductive layer was subjected successively to a water-developing process and a hard coating forming process as the same was passed through successive stations. Then, the conductive layer thus processed was baked at 100° C.

The photomask had a central part, peripheral part and a framing part respectively corresponding to a mesh part, a peripheral mesh part, and a grounding frame. The central part had square meshes defined by 22 μm wide bias lines arranged at pitches of 300 μm and inclined at 49°. The peripheral part had a width of 5 mm and lines having a width continuously increasing from 22 μm at the boundary of the central part and the peripheral part to 40 μm at the boundary of the peripheral part and the framing part. The framing part was 5 mm in width.

The conductive layer was carried to the next station, where a 40° C. ferric chloride solution having a Baume degree of 40° as an etchant was sprayed on the conductive layer for etching to form meshes in the conductive layer. Then, the conductive layer was processed at the following stations for rinsing, resist removal, washing and drying at 100° C. to complete an electromagnetic shielding sheet in Example 1.

COMPARATIVE EXAMPLE 1

An electromagnetic shielding sheet in Comparative example 1 was fabricated by a method similar to that of fabricating the electromagnetic shielding sheet in Example 1 and was similar in construction to that of the electromagnetic shielding sheet in Example 1, except that the electromagnetic shielding sheet in Comparative example 1 was fabricated by using a photomask having a central part and a peripheral part respectively corresponding to a mesh part and a peripheral mesh part, and different from that used for fabricating the electromagnetic shielding sheet in Example 1. The photomask had square meshes defined by 22 μm wide lines extending through the central part and the framing part, arranged at pitches of 300 μm, and inclined at 49°.

EXAMPLE 2

An electromagnetic shielding sheet in Example 2 was fabricated by coating the mesh part and the peripheral mesh part of an electromagnetic shielding sheet identical with that in Example 1 with a planarizing layer. A planarizing composition was applied to the surface of the electromagnetic shielding sheet so that the meshes are filled up with the planarizing composition. A 50 μm thick releasable PET film (SP-PET20-BU, made by Tohsero Company) was attached to the surface of the electromagnetic shielding sheet coated with the planarizing composition, the surface coated with the planarizing composition was exposed to radiation emitted by a high-pressure mercury lamp at a dose of 200 mj/cm² (365 nm equivalent), and then the releasable PET film was removed to smooth the surface of the planarizing layer. The ability of the electromagnetic shielding sheet in Example 2 was similar to that of the electromagnetic shielding sheet in Example 1.

The planarizing composition was prepared by blending 20 parts by mass of N-vinyl-2-pyrrolidone, 25 parts by mass of dicyclopentenyl acrylate, 52 parts by mass origoester acrylate (M-8060, made by Toa Gosei K. K.) and 3 parts by mass 1-hydroxycyclohexylphenyl ketone (Irugacure 184, made by CibaGeygy Company).

EXAMPLE 3

An electromagnetic shielding sheet in Example 3 was similar to that in Example 2, except that the electromagnetic shielding sheet in Example 3 was provided with a planarizing layer formed of a composition prepared by adding 1 part by mass of a thiol-nickel complex, namely, NIR-absorbing agent, to the planarizing composition used for forming the planarizing layer of the electromagnetic shielding sheet in Example 2. The ability of the electromagnetic shielding sheet in Example 3 was similar to that of the electromagnetic shielding sheet in Example 1 and was superior to the electromagnetic shielding sheet in Example 1 in effect on improving the visibility of displayed images.

EXAMPLE 4

An electromagnetic shielding sheet in Example 4 was the same as that in Example 2, except that the electromagnetic shielding sheet in Example 4 was provided with an NIR-absorbing film (NIR-absorbing Film No. 2832, made by Toyobo Company) bonded to a planarizing layer corresponding to that of the electromagnetic shielding sheet in Example 2 with a pressure-sensitive adhesive. The ability of the electromagnetic shielding sheet in Example 4 was similar to that of the electromagnetic shielding sheet in Example 1 and was superior to the electromagnetic shielding sheet in Example 1 in effect on improving the visibility of displayed images.

EXAMPLE 5

An electromagnetic shielding sheet in Example 5 was fabricated by a method similar to that of fabricating the electromagnetic shielding sheet in Example 1 and was similar in construction to that of the electromagnetic shielding sheet in Example 1, except that the electromagnetic shielding sheet in Example 5 was fabricated by using a photomask having a central part, a peripheral part and a framing part respectively corresponding to a mesh part, a peripheral mesh part and a grounding frame, and different from that used for fabricating the electromagnetic shielding sheet in Example 1. The central part had square meshes defined by 20 μm wide lines arranged at pitches of 250 μm and inclined at 60°. The peripheral part was 5 mm in width and had meshes defined by lines respectively continuous with the lines extending in the central part and having width continuously increasing from 20 μm at the boundary between the central part and the peripheral part to 26 μm at the boundary between the peripheral part and the framing part.

EXAMPLE 6

An electromagnetic shielding sheet in Example 6 was fabricated by a method similar to that of fabricating the electromagnetic shielding sheet in Example 1 and was similar in construction to that of the electromagnetic shielding sheet in Example 1, except that the electromagnetic shielding sheet in Example 6 was fabricated by using a photomask different from that used for fabricating the electromagnetic shielding sheet in Example 1 and having a central part, a peripheral part and a framing part respectively corresponding to a mesh part, a peripheral mesh part and a grounding frame. The central part had square meshes defined by 20 μm wide lines arranged at pitches of 250 μm and inclined at 60°. The peripheral part was 3 mm in width and had meshes defined by lines respectively continuous with the lines extending in the central part and having width continuously increasing from 20 μm at the boundary between the central part and the peripheral part to 26 μm at the boundary between the peripheral part and the framing part.

EXAMPLE 7

An electromagnetic shielding sheet in Example 7 was fabricated by a method similar to that of fabricating the electromagnetic shielding sheet in Example 1 and was similar in construction to that of the electromagnetic shielding sheet in Example 1, except that the electromagnetic shielding sheet in Example 7 was fabricated by using a photomask different from that used for fabricating the electromagnetic shielding sheet in Example 1 and having a central part, a peripheral part and a framing part respectively corresponding to a mesh part, a peripheral mesh part and a grounding frame. The central part had square meshes defined by 20 μm wide lines arranged at pitches of 300 μm and inclined at 49°. The peripheral part had a width corresponding to twenty-five meshes, and meshes defined by lines, which were respectively continuous with the lines extending in the mesh part and had width increased from 20 μm at the boundary between the central part and the peripheral part to 45 μm at the boundary between the peripheral part and the framing part in steps of 1.0 μm for each mesh.

EXAMPLE 8

An electromagnetic shielding sheet in Example 8 was fabricated by a method similar to that of fabricating the electromagnetic shielding sheet in Example 1 and was similar in construction to that of the electromagnetic shielding sheet in Example 1, except that the electromagnetic shielding sheet in Example 8 was fabricated by using a photomask different from that used for fabricating the electromagnetic shielding sheet in Example 1 and having a central part, a peripheral part and a framing part respectively corresponding to a mesh part, a peripheral mesh part and a grounding frame. The central part had square meshes defined by 20 μm wide lines arranged at pitches of 300 μm and inclined at 49°. The peripheral part had a width corresponding to five meshes, and meshes defined by lines, which were respectively continuous with the lines extending in the central part and had width increased from 20 μm at the boundary between the central part and the peripheral part to 35 μm at the boundary between the peripheral part and the framing part in steps of 3.0 μm for each mesh.

EXAMPLE 9

An electromagnetic shielding sheet in Example 9 was similar in construction to that in Example 2, except that the electromagnetic shielding sheet in Example 9 was provided with a PET film laminated to one surface of a conductive layer with the other surface thereof being blackened with Cu—Co alloy particles and finished by a chromating treatment.

(Result)

The photomask used for fabricating the electromagnetic shielding sheet in Example 1 had the central part having the square meshes defined by the 22 μm wide lines. The actual widths of the lines defining the meshes of the etched mesh part of the electromagnetic shielding sheet in Example 1 were in the range of 7 to 17 μm. The actual widths of ends of the lines defining the meshes in the etched peripheral mesh part joined to the mesh part were in the range of 7 to 17 μm, and those of ends of the same joined to the grounding frame were in the range of 17 to 29 μm.

In the electromagnetic shielding sheet in Comparative example 1, the actual widths of the lines defining the meshes in the etched peripheral mesh part from their ends joined to the mesh part to vicinities of the other ends were in the range of 10 to 16 μm, and those of the lines at the other ends joined to the grounding frame were in the wide range of 5 to 20 μm, which was larger in unevenness.

Planarizing layers similar to that of the electromagnetic shielding sheet in Example 2 were formed on one hundred electromagnetic shielding sheets in Example 1 and one hundred electromagnetic shielding sheets in Comparative example 1, respectively. The planarizing layers were formed normally on the electromagnetic shielding sheets in Example 1. Some of the lines of the two electromagnetic shielding sheets in Comparative example 1 were broken, and the yield was low.

One hundred electromagnetic shielding sheets in Example 1 and one hundred electromagnetic shielding sheets in Comparative example 1 were incorporated into PDPs, respectively. The electromagnetic shielding sheets in Example 1 could be incorporated into the PDPs without trouble. Some of the lines of one of the electromagnetic shielding sheets in Comparative example 1 were broken, and the yield was low.

Front plates were fabricated by using the electromagnetic shielding sheets in Examples 1 to 8 and Comparative example 1, and the front plates were placed on the front surfaces of PDPs, respectively. The visibility of images displayed by the plasma displays was satisfactory in all the cases.

The electromagnetic shielding sheet in Example 9 was attached to the PDP display with a pressure-sensitive adhesive with the surface of the base sheet being in contact with the PDP display. The PDP did not glare, the visibility of images displayed by the PDP was satisfactory, work for connecting electrodes to the electromagnetic shielding sheet were reduced, a printing process for printing a black frame was unnecessary.

The invention claimed is:

1. An electromagnetic shielding sheet comprising:
    a transparent base sheet; and
    a metal layer attached to one surface of the transparent base sheet;
    wherein the metal layer has a mesh part, a peripheral mesh part surrounding the mesh part, and a grounding frame surrounding the peripheral mesh part,
    a width of lines forming meshes in the peripheral mesh part gradually increases from the mesh part toward the grounding frame, and
    the width of lines forming meshes in the peripheral mesh part continuously increases from the mesh part toward the grounding frame.

2. An electromagnetic shielding sheet according to claim 1, wherein lines forming meshes in the mesh part have a fixed width.

3. An electromagnetic shielding sheet according to claim 1, wherein the peripheral mesh part has one to fifty meshes in a direction from the grounding frame toward the mesh part.

4. An electromagnetic shielding sheet according to claim 1, wherein the peripheral mesh part has a width between 0.15 and 15 mm in a direction from the grounding frame toward the mesh part.

5. An electromagnetic shielding sheet according to claim 3, wherein the peripheral mesh part has one to twenty-five meshes in a direction from the grounding frame toward the mesh part.

6. An electromagnetic shielding sheet according to claim 4, wherein the peripheral mesh part has a width between 0.3 and 7.5 mm in a direction from the grounding frame toward the mesh part.

7. An electromagnetic shielding sheet according to claim 1, wherein the width of lines forming meshes in the peripheral mesh part stepwise increases from the mesh part toward the grounding frame.

8. An electromagnetic shielding sheet according to claim 1, wherein at least one of surfaces of the metal layer is treated by a blackening treatment.

9. An electromagnetic shielding sheet comprising:

a transparent base sheet; and a metal layer attached to one surface of the transparent base sheet;

wherein the metal layer has a mesh part, a peripheral mesh part surrounding the mesh part, and a grounding frame surrounding the peripheral mesh part, a width of lines forming meshes in the peripheral mesh part gradually increases from the mesh part toward the grounding frame, at least one of surfaces of the metal layer is treated by a blackening treatment, and an antirust layer is formed at least on the surface of the metal layer treated by the blackening treatment.

10. An electromagnetic shielding sheet comprising:

a transparent base sheet; and a metal layer attached to one surface of the transparent base sheet;

wherein the metal layer has a mesh part, a peripheral mesh part surrounding the mesh part, and a grounding frame surrounding the peripheral mesh part, a width of lines forming meshes in the peripheral mesh part gradually increases from the mesh part toward the grounding frame, and at least meshes in the mesh part and the peripheral mesh part are filled up with a resin for substantial planarization of the metal layer.

11. An electromagnetic shielding sheet according to claim 10, wherein the resin contains a color-correcting light absorber capable of absorbing visible light of wavelengths of 570 to 605 nm and/or a near-infrared absorber capable of absorbing light of wavelengths in a near-infrared region of 800 to 1100 nm.

12. An electromagnetic shielding sheet according to claim 10, wherein a color-correcting light absorber layer capable of absorbing visible light of wavelengths of 570 to 605 nm and/or a near-infrared absorber layer capable of absorbing light of wavelengths in a near-infrared region of 800 to 1100 nm is provided on at least one surface of the electromagnetic shielding sheet.

* * * * *